United States Patent
Park et al.

(10) Patent No.: US 9,411,178 B2
(45) Date of Patent: *Aug. 9, 2016

(54) APPARATUS FOR ETCHING SUBSTRATE AND FABRICATION LINE FOR FABRICATING LIQUID CRYSTAL DISPLAY USING THE SAME

(71) Applicant: LG Display Co., Ltd., Seoul (KR)

(72) Inventors: Sang Min Park, Gumi (KR); Eun Sub Lim, Jeongnyeong-ri (KR); Won Seop Chun, Cheonan (KR); Man Heon Park, Goyang (KR)

(73) Assignee: LG Display Co., Ltd., Seoul (KR)

( * ) Notice: Subject to any disclaimer, the term of this patent is extended or adjusted under 35 U.S.C. 154(b) by 907 days.

This patent is subject to a terminal disclaimer.

(21) Appl. No.: 13/626,557

(22) Filed: Sep. 25, 2012

(65) Prior Publication Data

US 2013/0023180 A1    Jan. 24, 2013

Related U.S. Application Data

(62) Division of application No. 11/952,707, filed on Dec. 7, 2007, now Pat. No. 8,293,065.

(30) Foreign Application Priority Data

Dec. 8, 2006 (KR) .......................... 10-2006-0124994

(51) Int. Cl.
*G02F 1/13* (2006.01)
*H01L 21/67* (2006.01)
(Continued)

(52) U.S. Cl.
CPC .......... *G02F 1/1303* (2013.01); *H01L 21/6708* (2013.01); *H01L 21/6734* (2013.01); *H01L 21/67748* (2013.01)

(58) Field of Classification Search
None
See application file for complete search history.

(56) References Cited

U.S. PATENT DOCUMENTS 6,630,052 B1 * 10/2003 Kim .......................... 156/345.18
6,673,195 B2    1/2004 Chen et al.
6,894,744 B2 * 5/2005 Kim .............................. 349/110
(Continued)

FOREIGN PATENT DOCUMENTS

JP    03-047586    5/1991
JP    8-166568    6/1996
(Continued)

OTHER PUBLICATIONS

Office Action issued in corresponding Japanese Patent Application No. 2007317050, mailed Oct. 4, 2010.
(Continued)

*Primary Examiner* — Karla Moore
(74) *Attorney, Agent, or Firm* — Brinks Gilson & Lione

(57) ABSTRACT

A substrate etching apparatus includes: a cassette to receive a substrate that has finished a previous process, and transfer the substrate; a first robot to take the substrate out of the cassette; a second robot to receive the substrate from the first robot and move the substrate mounted thereon vertically up and down; an etching cassette comprising a support to support the substrate and a holder to fix the substrate loaded from the second robot; a cassette fixing unit to fix at least one or more etching cassettes and being rotated at a pre-set angle to allow the substrate to be disposed perpendicular to the ground; and an etching unit to etch the substrate disposed perpendicular to the ground by the cassette fixing unit.

19 Claims, 13 Drawing Sheets

(51) Int. Cl.
*H01L 21/673* (2006.01)
*H01L 21/677* (2006.01)

(56) References Cited

U.S. PATENT DOCUMENTS

2001/0049204 A1* 12/2001 Kuroda .................. 438/784
2007/0274814 A1* 11/2007 Kawasaki et al. ......... 414/217.1

FOREIGN PATENT DOCUMENTS

| JP | 10049065 A | 2/1998 |
|---|---|---|
| JP | 2001100165 A | 4/2001 |
| JP | 2002318545 A | 10/2002 |
| JP | 2003337314 A | 11/2003 |
| JP | 2004-78108 | 3/2004 |
| JP | 2004078108 A | 3/2004 |
| JP | 2005298314 A | 10/2005 |
| JP | 2006-18217 | 1/2006 |
| JP | 2006018217 A | 1/2006 |
| JP | 2007300118 A | 11/2007 |
| JP | 2008013389 A | 1/2008 |
| KR | 1998-0001895 | 3/1998 |
| KR | 10-2004-0017914 | 3/2004 |
| KR | 10-2004-0057144 | 7/2004 |

OTHER PUBLICATIONS

Office Action issued in corresponding Taiwan Patent Application No. 096146869, mailed Mar. 28, 2012.

Office Action issued in corresponding Korean Patent Application No. 10-2006-0124994, mailed Feb. 21, 2013.

* cited by examiner

APPARATUS FOR ETCHING SUBSTRATE AND FABRICATION LINE FOR FABRICATING LIQUID CRYSTAL DISPLAY USING THE SAME

The present patent document is a divisional of U.S. patent application Ser. No. 11/952,707, filed Dec. 7, 2007, which claims priority to Korean Patent Application No. 10-2006-0124994 filed in Korea on Dec. 8, 2006, which is hereby incorporated by reference.

BACKGROUND

1. Field of the Invention

The present disclosure relates to an apparatus and method for etching a substrate and, more particularly, to a fabrication line for fabricating a liquid crystal display (LCD) and its fabrication method capable of quickly etching a substrate by integrating a substrate etching line as in-line in a fabrication line.

2. Discussion of the Related Art

Recently, as diverse portable electronic devices such as mobile phones, PDAs or notebook computers are being developed, a flat panel display (FPD) is increasingly required that is light, thin, short and small and can be applicable to the portable electronic devices. As the FPD, the LCD, a PDP (Plasma display panel), an FED (Field Emission Display), a VFD (Vacuum Fluorescent Display) and an OLED (Organic Light Emitting Device), etc., are actively studied, and among them, the LCD is receiving much attention because of its mass-production techniques, fluidity of its driving unit and implementation of high picture quality.

The LCD is commonly applied for portable electronic devices, so a reduction in its size and weight is requisite to improve portability of the electronic devices. There can be several ways to reduce the size and weight of the LCD, and in terms of its structure and current technologies, there is a limitation in reducing essential elements of the LCD. The essential elements are quite light, so it is very difficult to reduce the weight of the LCD.

BRIEF SUMMARY

Therefore, in order to address the above matters the various features described herein have been conceived. One aspect of the exemplary embodiments is to provide an apparatus for etching a substrate capable of reducing a weight of a liquid crystal display (LCD) by etching a substrate or a liquid crystal panel.

Another aspect of the exemplary embodiments is to provide a fabrication line for fabricating an LCD capable of quickly etching a substrate by installing a substrate etching apparatus for automatically etching a substrate or a liquid crystal panel at a fabrication line, and thus capable of quickly fabricating an LCD.

This specification provides a substrate etching apparatus that may include: a cassette to receive a substrate that has finished a previous process, and to transfer the substrate; a first robot to take the substrate out of the cassette; a second robot to receive the substrate from the first robot and move the substrate mounted thereon vertically up and down; an etching cassette comprising a support to support the substrate and a holder to fix the substrate loaded from the second robot; a cassette fixing unit to fix at least one or more etching cassettes and being rotated at a pre-set angle to allow the substrate to be disposed perpendicular to the ground; and an etching unit to etch the substrate disposed perpendicular by the cassette fixing unit.

This specification also provides a fabrication line for fabricating an LCD that may include: an alignment film forming line to receive first and second substrates and form an alignment film with an anchoring force; a liquid crystal dropping line to receive the alignment film-formed first substrate and dropping liquid crystal on the first substrate; a sealant coating line to receive the alignment film-formed second substrate and costing a sealant; an attaching line to receive the first and second substrates and attach them; an etching line to etch the attached first and second substrates; and a processing line to receive the first and second substrates and divide them into a plurality of unit panels, wherein the alignment film forms line, the liquid crystal dropping line, the sealant coating line, the attaching line, the etching line, and the processing line are integrated.

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure.

The following constitute a listing of the drawings.

FIGS. 10A and 10B are partially enlarged views of the etching cassette in FIG. 9, in which FIG. 10A shows an unloaded state of the substrate and FIG. 10B shows a loaded state of the substrate.

DETAILED DESCRIPTION OF THE DRAWINGS AND THE PRESENTLY PREFERRED EMBODIMENTS

There can be several factors that play a role in determining a weight of a liquid crystal display (LCD), and among them, a glass substrate of the LCD is the heaviest component. Thus, it would be effective to reduce the weight of the glass substrate to reduce the weight of the LCD.

In general, the glass substrate is etched by an etchant (etching solution) such as an HF. Namely, the glass substrate is put in a container filled with an etchant to etch a surface of the glass substrate. However, in this method, because of non-uniformity of the substrate itself, the substrate is not evenly etched, and in addition, impurities generated during the etching process are attached on the substrate, making the surface of the substrate uneven. Moreover, an excessive use of the etchant leads to an increase in costs and causes the problem of an environmental contamination.

In one embodiment, the substrate can be loaded on a conveyer and the etchant can be applied to etch the substrate while moving the substrate. In this case, however, the etchant remains at a portion of the surface of the substrate loaded on the conveyer, over-etching that portion of the substrate, which results in an unevenly etched substrate on the whole.

Figure 1:
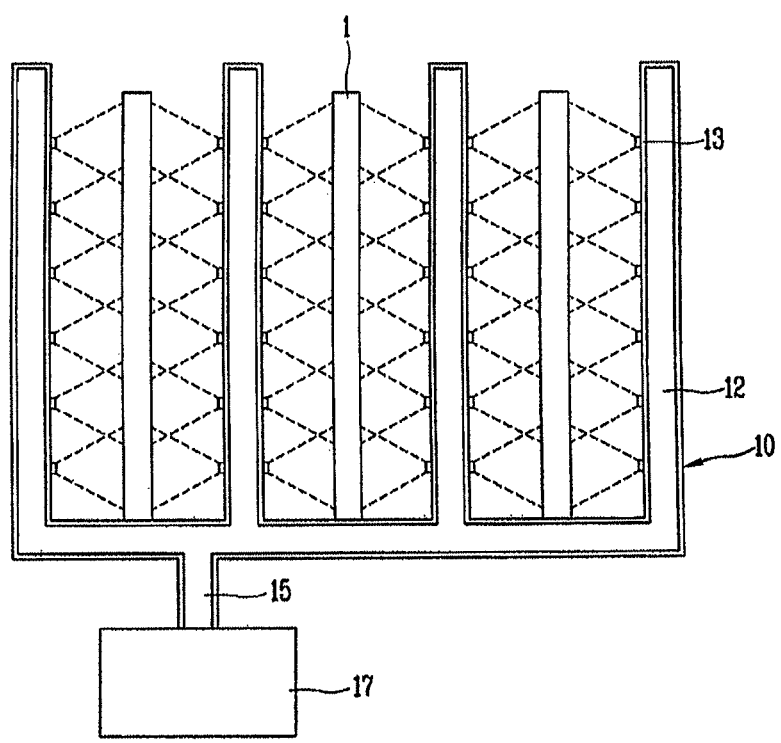
FIG. 1 illustrates the basic structure of a substrate etching apparatus according to the present disclosure.

Therefore, in the present disclosure, the substrate is disposed perpendicular to the ground and the etchant is sprayed to both surfaces of the substrate to uniformly etch the entire substrate. FIG. 1 shows a basic concept of the apparatus for vertically etching the substrate.

The etching of the substrate 1 can be made in a state such that two glass mother substrates are attached or by the unit of display panel. Namely, two glass mother substrates such as the LCD or a PDP (Plasma Display Panel) can be etched in an attached state or the substrates can be etched by the unit of attached panels. In the present disclosure, the etching apparatus can automatically etch the substrate transferred from a previous processing line, so by applying the etching apparatus to the fabrication line of the display panel, the fabrication line can be completely automated. Namely, the substrate, which has undergone the previous process, is automatically inputted to the etching line, etched and then outputted so as to be automatically transferred to the previous fabrication line. As the fabrication line is automated, the fabrication of the display panel can be quickly made and the fabrication efficiency can be considerably improved.

In addition, the substrate 1 can be etched by the unit of glass mother substrate or by the unit of processed glass substrate. Namely, the glass mother substrate fabricated during the glass fabrication process is etched to have a desired weight and thickness and processed to be used as a substrate of the flat panel display device such as the LCD. In general, the flat panel display device includes two attached glass substrates, so its strength can be higher than a single glass substrate. Thus, because it can be fabricated to be thinner than when using a single glass substrate, the weight of the glass substrate can be considerably reduced.

The etching of the glass substrates are generally performed on the attached mother substrates. In order to improve the efficiency in fabricating the flat panel display device such as the LCD, required elements such as thin film transistors and color filters are formed on the two facing mother substrates, and then the mother substrates are attached and cut into unit panels, forming respective display panels. In the present disclosure, etching of the substrate is made by the unit of the attached mother substrates before being cut into the unit panels for the following reasons.

When the substrates are etched, the etching degree is limited. If the substrate is over-etched to become too thin, the substrate would be damaged during the fabrication process. Thus, the glass substrate is limited in its etching by the unit of the mother substrate. However, when the two substrates are attached (or in case of the attached glass panels), the substrates can have stronger force to tolerate an impact although they are etched more than the mother substrate, so the mother substrates can be etched more to reduce the weight when the display panels are fabricated.

In the present disclosure, the etching targets etched by the etching apparatus can be unit mother substrates, processed substrates, and divided unit panels without being limited to the attached mother substrates. Accordingly, the term "substrate" used hereafter will cover the attached mother substrates, the glass mother substrates, the processed substrates, and the divided unit panels.

As shown in FIG. 1, the vertical etching apparatus 10 includes spray plates 12 disposed at uniform intervals, the substrates 1 being disposed therebetween; a plurality of nozzles 13 formed on the spray plates 12; and an etchant storage tank 17 for supplying an etchant solution to the spray plates 12. Because the interior of the spray plates 12 are empty, the etchant of the etchant storage tank 17 is supplied to the spray plates 12 through a supply pipe 15.

The etchant supplied into the interior of the spray plates 12 is sprayed onto the surface of the substrates 1 by the nozzles 13 to etch the substrates 1. Because the substrates 1 are positioned between the spray plates 12, the etchant sprayed from the nozzles 13 of the spray plates 12 positioned at both sides thereof reaches both sides of the substrates 1 and etches both sides of the substrates 1.

The number and interval of the nozzles 13 of the spray plates 12 are determined depending on the size of the substrates 1 to be etched and the distance between the spray plates 12 and the substrates 1. Any number or any interval, however, can be possible so long as the etchant can be evenly sprayed to the substrates 1.

In the etching apparatus, the substrates 1 are etched by uniformly spraying the etchant onto the substrates 1 disposed to be perpendicular to the ground. Thus, the etchant sprayed to the substrates 1 flows down by gravitation, leaving no etchant remaining on the substrates 1. Because the etchant does not remain on a particular portion, over-etching of a particular portion can be prevented.

The spray plates 12 extend from a lower base in an upward direction so the substrates 1 are received from the upper side and disposed between the spray plates 12, but without being limited thereto, the base can be positioned at the upper side and the spray plates 12 extend in a downward direction. In that case, the substrates 1 can be received from the lower side and disposed between the spray plates 12, or the spray plates 12 can be lowered at both sides of the substrates 1.

Figure 2A:
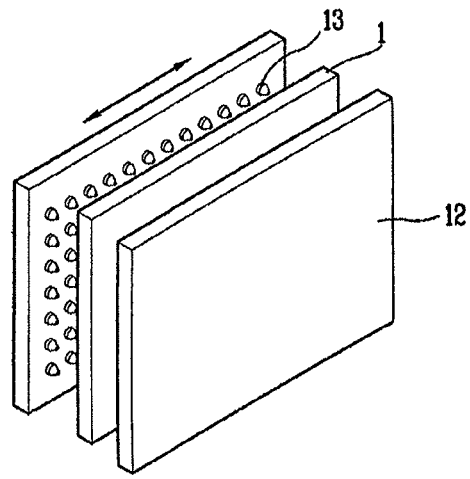
FIGS. 2A to 2C are perspective views for schematically showing the substrate etching apparatus according to the present disclosure.
Figure 2B:
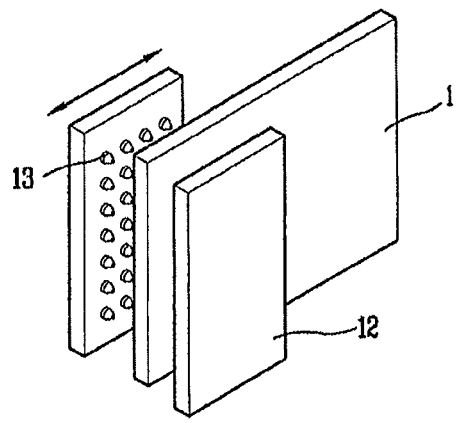

FIGS. 2A and 2B are perspective views for schematically showing the substrate etching apparatus according to the present disclosure.

As shown in FIG. 2A, as for the length and height of the spray plates 12 positioned at both sides of the substrate 1 to be etched, the spray plates 12 may have the same area as that of the substrate 1 or be larger than the substrate 1, so that the etchant can be sprayed over the entire surface of the substrate 1 at a uniform pressure, thus quickly etching the substrate 1.

FIG. 2B shows a substrate etching method when the size of the spray plates 12 with the nozzles 13 formed thereon is smaller than that of the substrate 1. In such an etching apparatus, because the size (or width) of the spray plates 12 is smaller than that of the substrate 1, in etching the entire surface of the substrate 1, the spray plates 12 are reciprocally moved at a certain speed from one side to the other side to spray the etchant onto the substrate 1. The reason for this is as follows.

Figure 3:
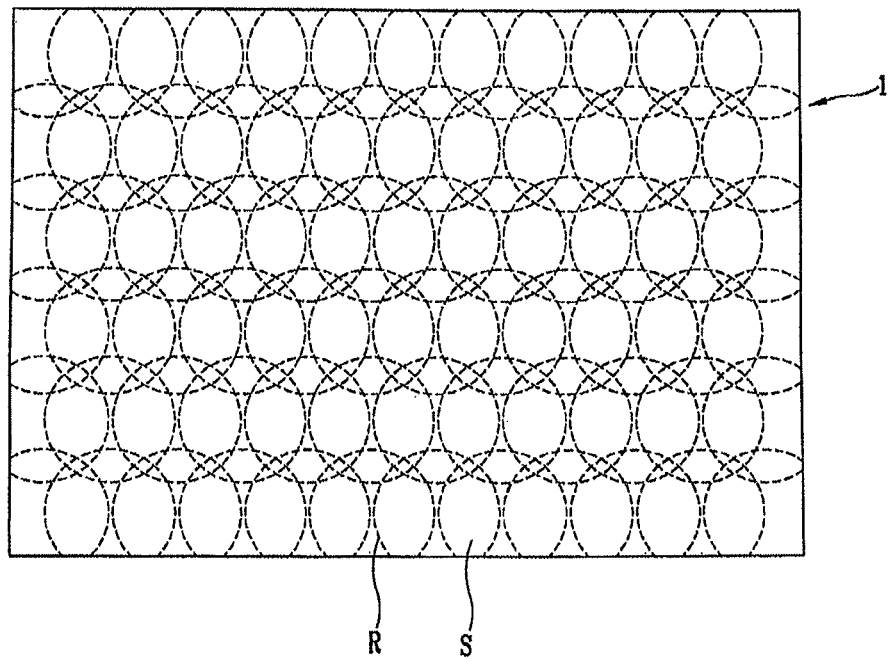
FIG. 3 illustrates an etching solution sprayed region on a substrate as sprayed by the substrate etching apparatus in FIG. 2A.

FIG. 3 shows spray regions (R) of the etchant sprayed onto the substrate 1 through the nozzles 13 of the spray plates 12. As shown in FIG. 3, the etchant sprayed from the nozzles 13 reaches certain regions of the surface of the substrate 1. In order to spray the etchant from the nozzles 13 of the spray plates 12 over the entire surface of the substrate 1 to etch it, one spray region (R) of the etchant sprayed from each nozzle 13 should overlap with another spray region (R) of etchant sprayed from each adjacent nozzle 13 to prevent generation of a region where the etchant is not sprayed. In this case, however, when the etchant is sprayed from the adjacent nozzles 13 in the overlapping manner, more etchant is applied to the etchant overlap regions (S), over-etching them, causing the substrate 1 to be unevenly etched as a whole.

In order to form the spray regions (R) over the entire surface of the substrate 1, the number of nozzles 13 of the spray plates 12 increases, which means that the etchant sprayed through the nozzles 13 also increases. Thus, the etchant is excessively used, which increases cost and causes environmental contamination.

However, when the spray plates 12 are disposed at one side of the substrate 1 and spray the etchant while moving at a certain speed, spray overlap regions (R) are not generated, so uneven etching of the substrate can be prevented. In addition, because the etchant is sprayed from the spray plates 12 at a uniform pressure and the spray plates 12 move at a uniform speed, the etchant is applied over the entire surface of the substrate 1, evenly etching the substrate 1. In this case, the spray plates 12 can be reciprocally moved several times by certain periods to spray the etchant onto the substrate 1 to perform etching thereon.

As stated above, the spray plates 12 have the same area as or a larger area than that of the substrate 1 to spray the etchant over the entire surface of the substrate 1 through the nozzles 13 at one time. Or, the spray plates 12 having a smaller area than that of the substrate 1 are moved along the substrate 1 or vibrated at certain periods to spray the etchant to the substrate 1 to perform the etching thereon. Controlling the area of the spray plates 12 or moving the spray plates 12 is to evenly spray the etchant onto the substrate to thus evenly etch the substrate. Thus, the etching apparatus may have any construction so long as it can uniformly spray the etchant to the substrate 1.

For example, when the spray plates 12 have an area smaller than that of the substrate, the intervals of nozzles 13 can be controlled to evenly apply the etchant over the entire surface of the substrate 1, or the spray plates 12 can be reciprocally moved one time or several times with respect to the side of the substrate 1 to spray the etchant such as to evenly etch the substrate 1.

Figure 2C:
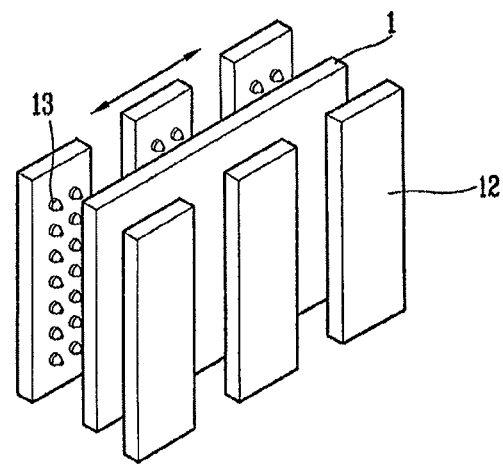

With reference to FIG. 2C, several spray plates 12 having a smaller area than that of the substrate 1 can be provided to be moved or reciprocally moved along one direction of the substrate 1 to spray the etchant on the substrate 1. Also, the spray plates 12 can be vibrated at a certain angle or at certain periods to spray the etchant from the nozzles 13 to a larger area, thus evenly spraying the etchant over the entire surface of the substrate 1.

In the present disclosure, because the etching apparatus may be automated, the efficiency of the substrate etching can be improved. In other words, the efficiency is due to the loading to or unloading from the etching apparatus being automatically performed by the robot by interworking within the overall fabrication lines, not manually by an operator. As the substrates are automatically loaded to and unloaded from the etching apparatus, not only the etching efficiency can be improved but also the etching apparatus (or the etching line) can be integrated with the previous processing line or the following process line.

Figure 4:
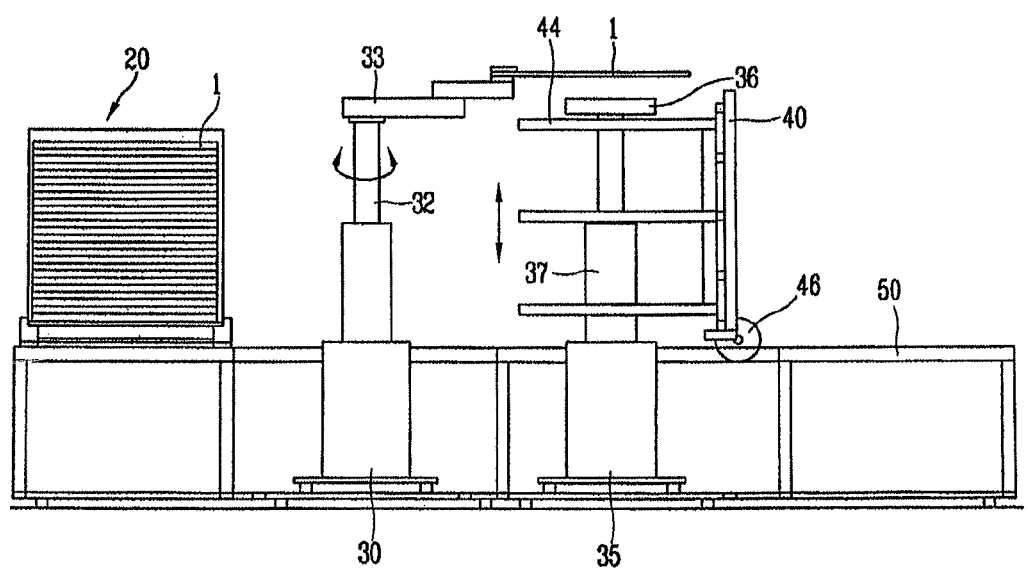
FIG. 4 illustrates a substrate etching apparatus according to the present disclosure.

FIG. 4 illustrates an automated substrate etching apparatus according to the present disclosure. As shown in FIG. 4, the substrate etching apparatus according to the present disclosure includes: a cassette 20 for receiving a substrate 1; a first robot 30 for extracting the substrate 1 received in the cassette 20; and a second robot 35 for receiving the substrate 1 extracted by the first robot 30 and transferring it to an etching cassette 44.

The cassette 20 is transferred from a previous process. That is, the substrate 1 processed in the previous process is transferred in the cassette 20. The first robot 30 includes a rotational shaft 32 and a robot arm 33. The substrate 1 mounted on the robot arm 33 is mounted on a substrate mounting part 36 of the second robot 35 according to a rotation of the rotational shaft 32. The second robot 35 includes a vertically movable extending shaft 37 that moves the substrate 1 mounted on the substrate mounting part 36 formed at its end portion in a vertical direction.

The substrate 1 loaded from the second robot 35 is fixed on the etching cassette 44, and the etching cassette 44 is fixed at a cassette fixing unit 40. Multiple units of etching cassettes 44 are fixed at the cassette fixing unit 40 at pre-set intervals and rotated by 90 degrees centering about a rotational shaft 41 formed at an end portion of the cassette fixing unit 40. Namely, the substrate 1 fixed at the etching cassette 44 in the horizontal direction of the ground by the first and second robots 30 and 35 is disposed to be perpendicular to the ground according to a rotation of the cassette fixing unit 40. The substrate 1 disposed to be perpendicular to the ground is transferred to the etching apparatus through a conveyer 50 and etched.

Figure 5A:
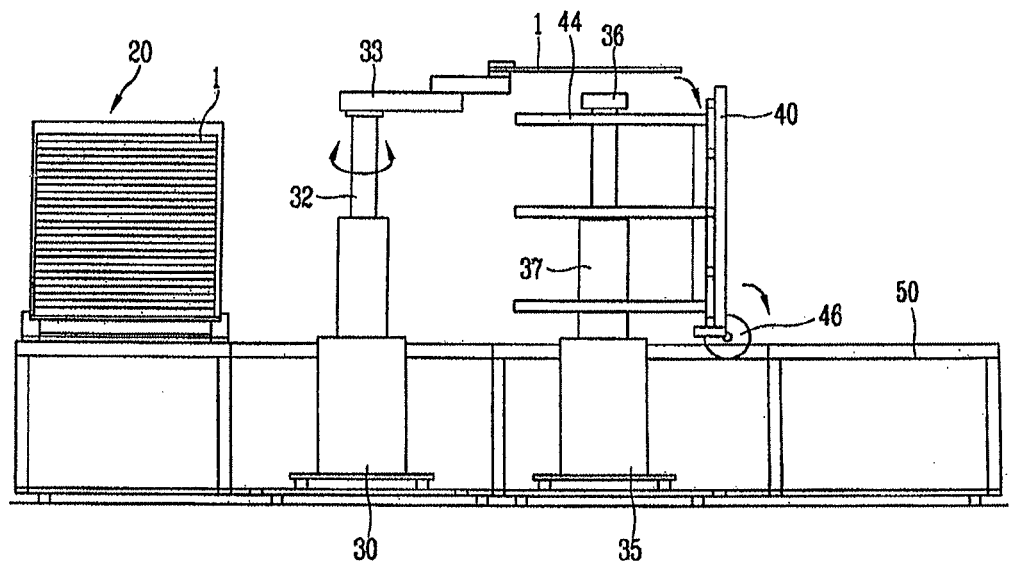
FIGS. 5A to 5C show a substrate etching method using the substrate etching apparatus according to the present disclosure.
Figure 5B:
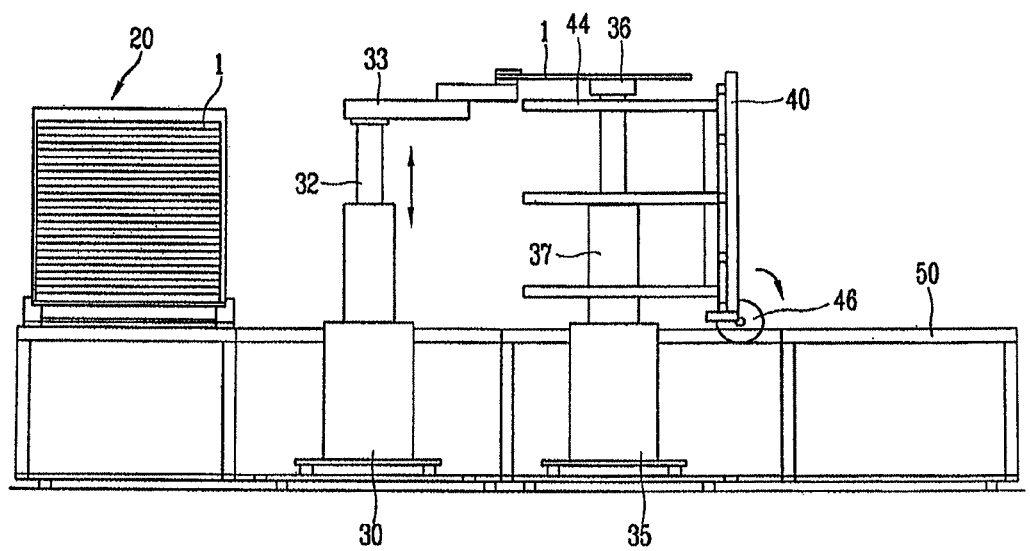
Figure 5C:
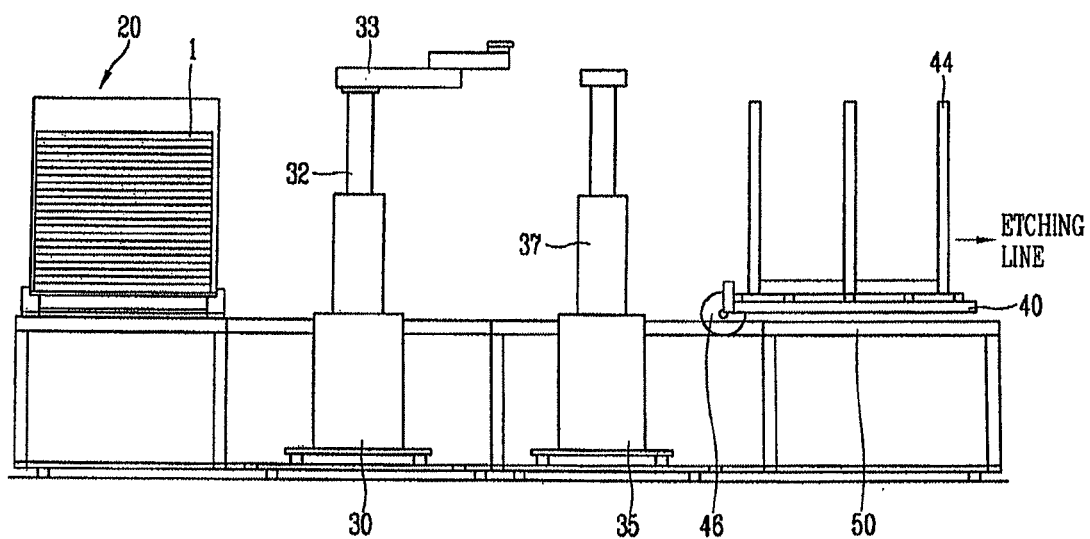

FIGS. 5A to 5C show a substrate etching method using the substrate etching apparatus according to the present disclosure. First, as shown in FIG. 5A, when the cassette 20 with the substrate 1 received therein is transferred, the robot arm 33 of the first robot 30 is carried into the cassette 20 to take the substrate 1 out of the cassette 20. The substrate 1 received in the etching apparatus can be a substrate which has undergone various processes. For example, the substrate 1 is the glass substrate itself, or a substrate of a unit area which has undergone a cutting process in which the glass original plate is cut to particular areas, or can be a substrate processed to have a particular shape. In addition, the substrate 1 can be two attached mother substrates or a unit panel obtained by cutting the attached substrates. The process may include every process in which the glass substrate can be processed without being limited to a particular process.

As shown in FIG. 5B, the substrate taken out of the cassette 20 by the first robot 30 is mounted on the substrate mounting part 36 of the second robot 35 according to the rotation of the rotational shaft 32 of the first robot 30. Because the second robot 35 is disposed to be movable up and down in the etching cassette 44, as the second robot 35 is lowered, the substrate 1 loaded on the second robot 35 by the first robot 30 is fixed on the etching cassette 44.

The etching cassette 44 fixes the loaded substrate 1 and transfers the fixed substrate 1 into an etching unit to actually perform etching thereon. The etching cassette 44 automatically fixes the substrate 1 and transfers it into the etching unit, thereby making the overall etching process is line in-line. The etching cassette 44 is not limited to a particular structure, but may have any structure so long as it can effectively fix or secure the substrate 1.

Figure 6A:
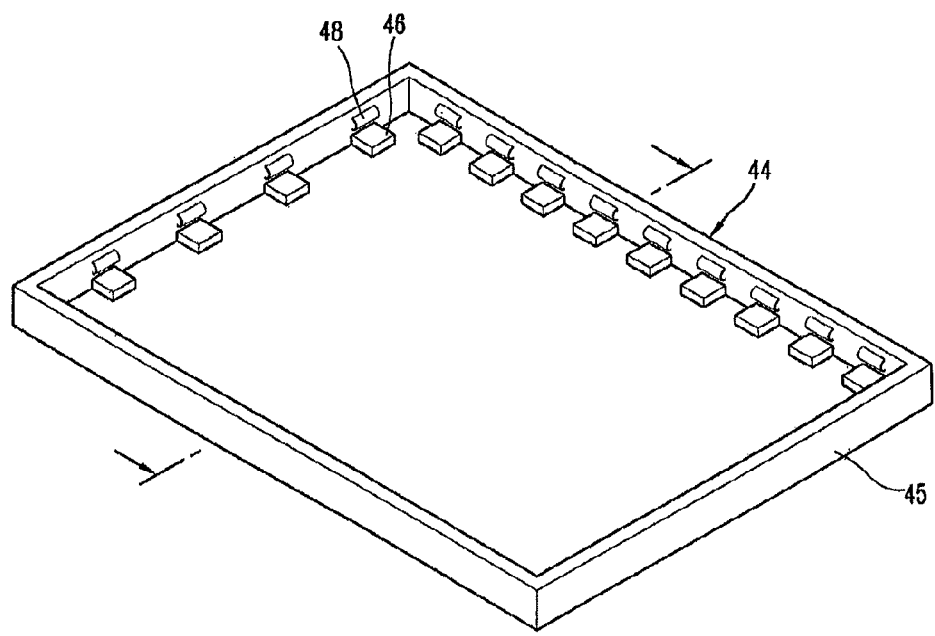
FIG. 6A is a perspective view of an etching cassette of the substrate etching apparatus according to the present disclosure.
Figure 6B:
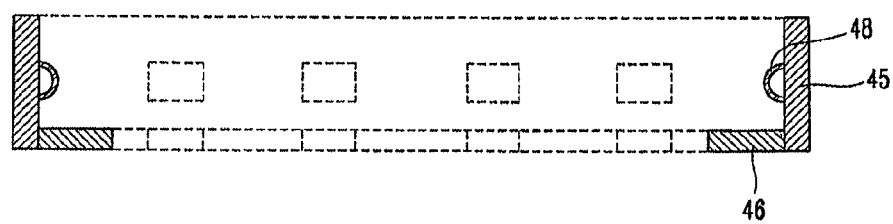
FIG. 6B is a cross-sectional view of the etching cassette of the substrate etching apparatus according to the present disclosure.

FIGS. 6A and 6B show one example of the etching cassette 44 employed for the etching apparatus. As shown in FIGS. 6A and 6B, the etching cassette 44 includes a cassette body 45, a plurality of supports 46 formed on the cassette body 45 and supporting the loaded substrate 1; and holders 48 installed on the cassette body 45 and fixing the loaded substrate 1. The supports 46 are formed at certain intervals to support the loaded substrate 1 as their upper surfaces contact with the bottom surface of the substrate 1. In this case, the number of supports 46 may vary depending on the size of the cassette body 45, namely, the size or weight of the substrate 1 to be etched. The supports 46 can be formed on both facing sides of the cassette body 45 or can be formed on four sides thereof.

The width of the support 46 varies depending on the size and the weight of the substrate 1 or the number of supports 46, and the length of the support 46, namely, the length extending to the substrate, corresponds to a width of a dummy region that is not used when the substrate 1 is used for a particular purpose.

The holders 48 fix the substrate 1 loaded on the etching cassette 44. As shown in FIG. 6A, the holders 48 are made of a material which has good elasticity and is thin such as a plate spring, so as to be moved in an inward direction by pressure. However, the holder 48 according to the present disclosure is not limited to such a structure. The illustrated structure is an example of the holder 48 according to the present disclosure and, substantially, the holder 48 can be implemented in various shapes.

Multiple holders 48 are formed in the etching cassette 44. The holders 48 can be formed at both facing sides of the cassette body 45, can be formed at four sides thereof, or can be formed corresponding to the supports 46. The holders 48 and the supports 46 are formed at the same positions of the etching cassette 44 to face each other, or can be formed at different positions. In particular, the holders 48 and the supports 46 are formed in crisscross relation to apply a force to different regions of upper and lower surfaces of the substrate 1. Because the holders 48 and the supports 46 are formed crisscross (or in zigzags), only one-directional force is applied to the region where the holders 48 and the supports 46 contact with each other, so when the substrate 1 is stood to be perpendicular to the ground, a slight gap can be generated between the substrate 1 and the holders 48 and between the substrate 1 and the supports 46. When the substrate 1 is etched, the etchant may infiltrate through the gap between the substrate 1 and the holders 48 and the gap between the substrate 1 and the supports 46, so a particular region of the substrate 1 contacting with the holders 48 and the supports 46 can be etched.

The loading of the substrate 1 to the etching cassette 44 will now be described with reference to FIGS. 7 and 8. FIGS. 7A and 7B show loading of the substrate 1 to the etching cassette 44, and FIGS. 8A and 8B show unloading of the substrate 1 from the etching cassette 44.

Figure 7A:
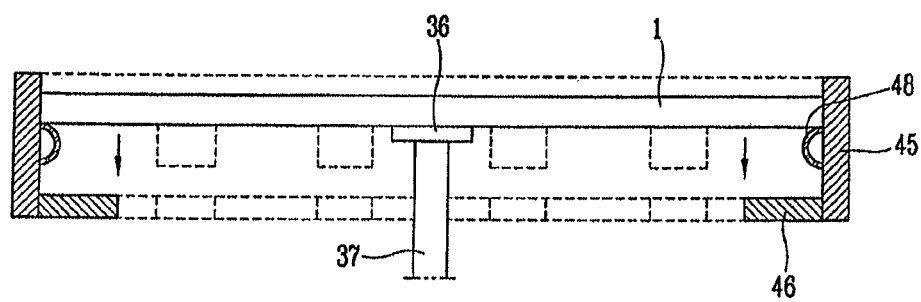
FIGS. 7A and 7B illustrate loading of the substrate onto the etching cassette.
Figure 7B:
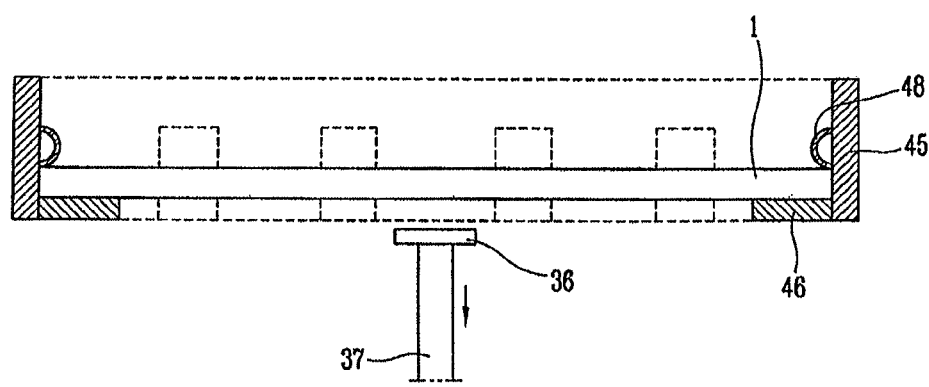

In loading the substrate 1 to the etching cassette 44, as shown in FIG. 7A, when the substrate 1 is mounted on the substrate mounting part 36 of the second robot 35 according to the rotation of the first robot 30, the extending shaft 37 of the second robot 35 is lowered. Then, as the extending shaft 37 is lowered, the substrate 1 mounted on the substrate mounting part 36 is also lowered and the edges of the substrate 1 contacts with the holders 48.

As the extending shaft 37 of the second robot 35 is lowered, the substrate 1 mounted on the substrate mounting part 36 is also lowered and the holders 48 contacting with the substrate 1 move toward the inner side, namely, toward the cassette body 45 by virtue of the weight of the substrate 1. As the holders 48 are moved toward the cassette body 45, the substrate 1 is also moved in a downward direction in a state of being in contact with the holders 48, and then mounted on the supports 46 upon completely passing by the holders 48 as shown in FIG. 7B. Because the pressure to the holders 48 by the weight of the substrate 1 is removed, the holders 48 return to their original shape by elasticity and the lower portions of the holders 48 contact with the upper surface of the substrate 1, securely fixing the substrate 1.

Figure 8A:
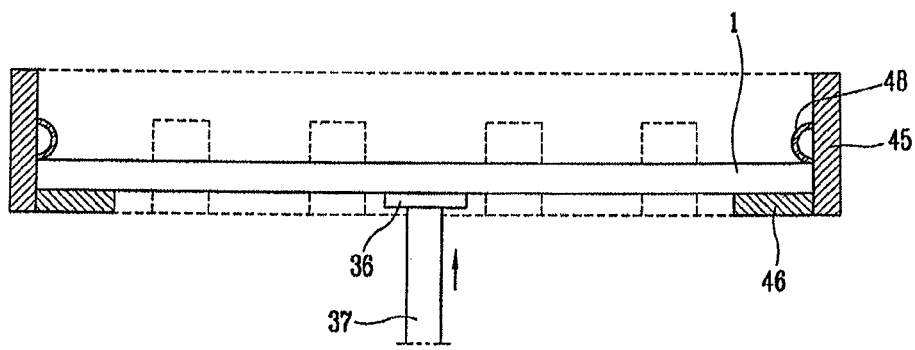
FIGS. 8A and 8B illustrate unloading of the substrate from the etching cassette.

With reference to FIG. 8A, when the substrate 1 is unloaded from the etching cassette 44, the extending shaft 37 of the second robot 35 is lifted to allow the substrate mounting part 36 to contact with the lower surface of the substrate 1. Subsequently, the extending shaft 37 is continuously lifted to allow the substrate 1 to be moved up in an upward direction. In this case, because the upper surface of the substrate 1 fixedly contacts with the holders 48, the holders 48 are pressed as the substrate 1 is moved up. Then, the holder 48 is contracted toward the cassette body 45, and such a contact is made when the substrate 1 is moved up and continues until the substrate 1 does not contact with the holders 48.

Figure 8B:
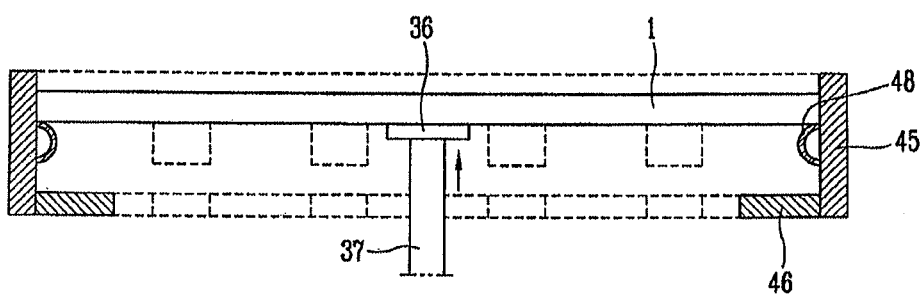

As shown in FIG. 8B, when the substrate 1 is moved up further, the substrate 1 completely released from the etching cassette 44 and, at the same time, the holders 48 are returned to their original shapes by elasticity.

As mentioned above, the substrate 1 is fixed in the etching cassette 44 as the holders 48 are contracted by gravity, and released from the etching cassette 44 as the holders 48 are contracted by the lifting force of the second robot 35. Accordingly, the substrate 1 can be loaded to the etching cassette 44 so as to be fixed or unloaded from the etching cassette 44 so as to be released by the second robot 35 without any additional operation.

Figure 9:
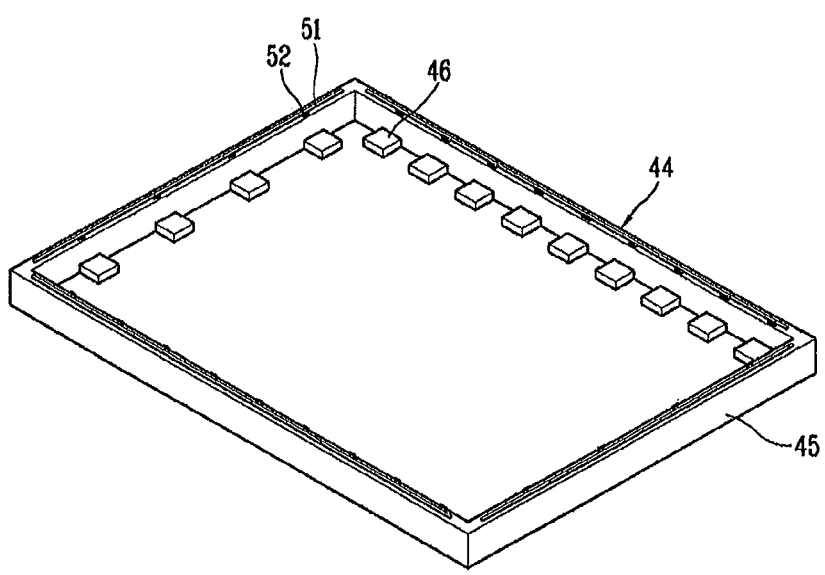
FIG. 9 is a perspective view showing a different structure of the etching cassette of the substrate etching apparatus according to the present disclosure.

FIG. 9 shows an etching cassette 44 with a different structure employed for the etching apparatus according to the present disclosure. As shown in FIG. 9, the etching cassette 44 includes a cassette body 45, a plurality of supports 46 formed in the cassette body 45 and supporting the substrate 1 loaded thereon; a clamping 52 installed at the cassette body 45 and fixing the loaded substrate 1; and a clamping driving unit 51 for fixing the substrate 1 by operating the clamping 52.

The supports 46 are formed at uniform intervals on the cassette body 45 and support the substrate 1 such that their upper surfaces contact with the bottom surface of the substrate 1. In this case, the number of supports 46 may vary depending on the size or weight of the substrate 1 to be etched. In addition, the supports 46 can be formed on both facing sides of the cassette body 45 or can be formed at four sides thereof.

In addition, the width of the support 46 varies depending on the size and the weight of the substrate 1 or the number of supports 46, and the length of the support 46, namely, the length extending to the substrate, corresponds to a width of a dummy region that is not used when the substrate 1 is used for a particular purpose. The clamping 52 and the supports 48 can be formed at the same positions to face each other or can be positioned at different positions, for example, between each other so as to be crisscross or in zigzags. The clamping 52 can be rotated by the clamping driving unit 51 to load and fix, or unload and release, the substrate. In this case, although not shown, the cassette body 45 may include a sensor for sensing loading or unloading the substrate 1 to or from the etching cassette 44 to drive the driving unit 51.

Figure 10A:
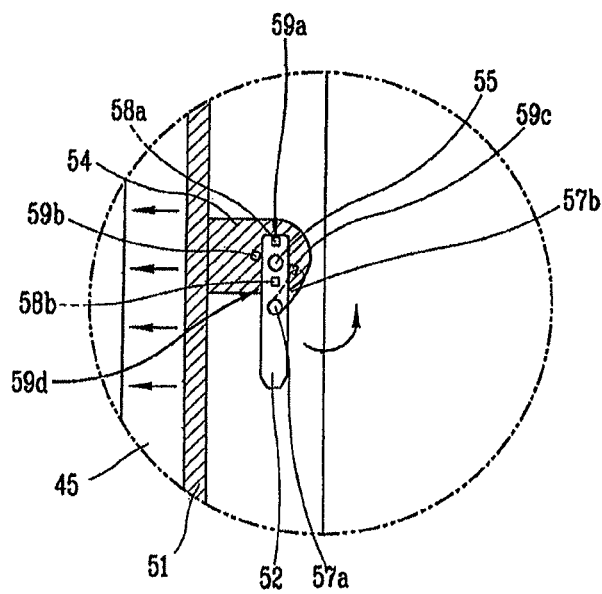
Figure 10B:
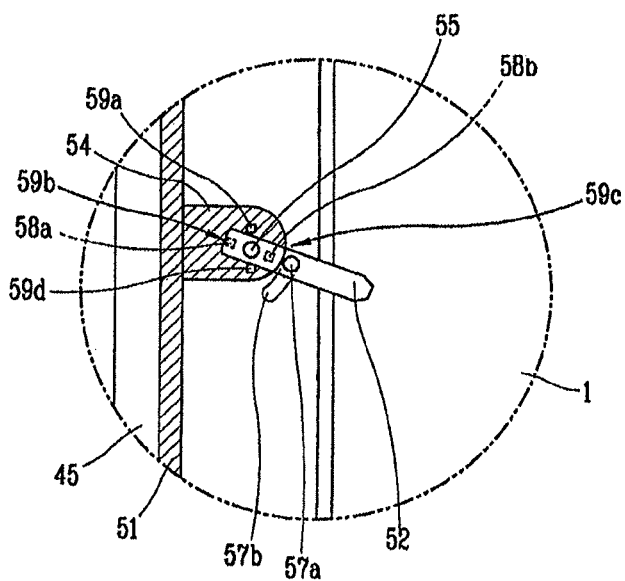

FIGS. 10A and 10B are partially enlarged views of the etching cassette 44 in FIG. 9. FIG. 10A shows an unloaded state of the substrate from the etching cassette 44 and FIG. 10B shows a loaded state of the substrate 1 to the etching cassette 44. The method for fixing the substrate 1 by the etching cassette 44 will now be described.

As shown in FIG. 10A, the clamping driving unit 51 is installed at an upper surface of the cassette body 45, and a plurality of connectors 54 are formed at one side of the clamping driving unit 51. The clamping 52 is fixed at the connector 54. A fixing pin 55 is installed at an end portion of the clamping 52 and fixed at the connector 54. A rotatable pin 57a is provided in the clamping 52 and a guide groove 57b along which the rotatable pin 57a moves is provided at the cassette body 45, so as to be fixed at the cassette body 45 such that the clamping 52 can be rotated centering around the rotatable pin 57a as the rotatable pin 57a moves along the guide groove 57b. In other words, when the clamping 52 is rotated, the rotatable pin 57a moves along the guide groove 57b, so the clamping 52 can be smoothly rotated.

Two magnets 58a and 58b are disposed at one end portions of the clamping 52 and another four magnets 59a, 59b, 59c and 59d are also disposed at the connector 54, which are attached by magnetism with the two magnets 58a and 58b of the clamping 52. Because the magnets are disposed at the clamping 52 and the connector 54, the clamping 52 can be firmly fixed to the connector 54 by the magnetic force of the magnets.

A plurality of clampings 52 are formed at the etching cassette 44. The clampings 52 can be formed at both facing sides of the cassette body 45 or at four sides of the cassette body 45, or can be formed corresponding to the supports 46.

With reference to FIG. 10A, when the substrate 1 is not loaded on the etching cassette 44, the clamping 52 is disposed to be substantially parallel to one side of the cassette body 45, namely, to the clamping driving unit 51. In this case, the clamping 52 is fixed by the magnetic force between the first magnets 58a and 58b formed at the end portion of the clamping 52 and the corresponding second Magnets 59a and 59d of the connector 54.

With reference to FIG. 10B, when the substrate 1 extracted from the cassette 20 by the first robot 30 is loaded to the etching cassette 44 by the second robot 35, the loading of the substrate 1 is sensed by a sensor (not shown) installed at the cassette body 45, and at the same time, the clamping driving unit 51 starts to move to one side, namely, to the opposite side of the region of the cassette body 45 where the substrate 1 is loaded. Namely, the clamping driving unit 51 starts to move to an outer side of the cassette body 45. Although not shown, a guide unit for guiding the clamping driving unit 51 such as a guide rail can be formed at the cassette body 45 in order to move the clamping driving unit 51 by a driving unit such as a motor. Various types of sensors can be used. For example, an optical sensor can be used by using a difference of transmittance of light that transmits through the substrate 1 or a load sensor for sensing a load when the substrate 1 is loaded to the cassette body 45 can be also used.

As the clamping driving unit 51 moves, the connector 54 is moved, and accordingly, the end portion of the clamping 52 connected with the connector 54 also moves by the fixing pin 55. Meanwhile, the rotatable pin 57a moves along the guide groove 57b formed at the cassette body 45 while the clamping 52 is rotatably fixed at the rotatable pin 57a, so the region of the clamping 52 fixed by the rotatable pin 57 is fixed rather than moving according to the movement of the clamping driving unit 51. In other words, only one end portion of the clamping 52 fixed by the fixing pin 55 moves, and at the same time, the other end portion of the clamping 52 is rotated centering around the rotatable pin 57a while moving along the guide groove 57b. Accordingly, the end portion of the clamping 52 which is not fixed by the fixing pin 55 is rotated to the region where the substrate 1 is loaded. The rotated clamping 52 is fixed to the connector 54 by the magnetic force between the first magnets 58a and 58b and the corresponding second magnets 59b and 59c, maintaining the rotated state as it is.

When etching is completed, the clamping driving unit 51 is operated, the end portion (namely, the end portion fixed by the fixing pin 55) of the clamping 52 moves, and the rotatable pin 57a moves again along the guide groove 57b to allow the clamping 52 to be rotated centered about the rotatable pin 57a. Accordingly, the clamping 52 is arranged to be substantially parallel to the cassette body 45 so as to be ready for unloading the substrate 1. In this manner, the substrate 1 can be fixedly attached to, or detached from, the etching cassette 55 automatically by rotating the clamping 52 by sensing the loading of the substrate.

With reference to FIG. 5B, a plurality of substrates 1 are fixed on the etching cassette 44. The substrate 1 first fixed on the etching cassette 44 is fixed on the top of the etching cassette 44 by the second robot 35. Thereafter, when the first robot 30 takes the substrate 1 out of the cassette 20 and transfers it to the second robot 35, the substrate 1 is lowered as far as a pre-set distance by the second robot 35 and puts the substrate 1 on the etching cassette 44 fixed at a second position of the cassette fixing unit 40, and the holder 46 fixes the substrate. This operation is repeatedly performed to load substrates 1 on every etching cassettes 44 provided at the cassette fixing unit 40.

Thereafter, as shown in FIG. 5C, when the etching cassettes 44 with the substrates 1 loaded thereon are all fixed to the cassette fixing unit 40, the cassette fixing unit 40 is rotated by 90 degrees centered about the rotational shaft 41 installed at one end thereof. As the cassette fixing unit 40 is rotated, the substrates 1 which have been disposed to be parallel to the ground are disposed to be perpendicular to the ground, and in this state, the substrates 1 are inputted to the etching apparatus along the cassette transfer unit 50 such as a guide or a conveyer, and etching is performed.

As shown in FIG. 1, the etching lines include spray plates 12 having the plurality of nozzles 13 that spray the etchant, the etchant storage tank 17 for supplying the etchant to the spray plates 12, and the supply pipe 12 for supplying the etchant of the etchant storage tank 17 to the spray plates 12.

The cassette fixing unit 40 transferred along the conveyer 50 is disposed within the etching apparatus 10 so that the etching cassettes 44, namely, the substrates 1, are positioned between the spray plates 12 as shown in FIG. 1. In this case, the transferred cassette fixing unit 40 can be rotated according to position of the spray plates 12 of the etching apparatus 10.

In FIG. 1, the lower portions of the spray plates 12 are connected and the spaces between the spray substrates 1 are opened at the upper portions, but without being limited thereto, the upper portions of the spray plates 12 can be connected and the spaces between the spray plates 12 can be opened at the lower portions. As the spaces between the spray plates 12 are opened at the lower portions, the cassette fixing unit 40 positioned at the lower portion of the etching cassette 44 is disposed at the opened space and positioned between the spray plates 12.

When the cassette fixing unit 40 is inputted in the etching apparatus and the substrates 1 are etched by a pre-set thickness, the substrates 1 are outputted from the etching apparatus in the reverse order to the order in which the substrates 1 were inputted. Namely, when the etching is terminated, the cassette fixing, unit 40 inputted in the etching apparatus is outputted and returned to its original position along the conveyer 50 and the second robot 35 takes out the substrates 1 fixed at the etching cassettes 44. The unloading of the substrates 1 is performed by the processes described with reference to FIGS. 10A and 10B.

The substrates 1 are taken out of the etching cassettes 44, mounted on the substrate mounting part 36 of the second robot 35, returned to the first robot 30, and then received at the cassette 20. In this case, the substrates 1 discharged from the cassette fixing unit 40 are sequentially discharged, starting from the substrate 1 positioned at the lower portion of the cassette fixing unit 40.

The substrates 1 re-received in the cassette 20, namely, the etched substrate 1, are transferred to undergo a follow-up process. As mentioned above, when the substrates 1, which has finished the previous process, is transferred in the cassette 20, the substrate 1 is automatically loaded to the etching cassette 44 by the first and second robots 30 and 35, and then inputted to the etching apparatus so as to be etched. In particular, after the substrate 1 is automatically loaded to be fixed in the etching cassette 44, fixed at the cassette fixing unit 40, and inputted to the etching apparatus in a direction perpendicular to the ground, the substrate 1 can be not only evenly etched, but also quickly etched.

The etching of the substrate 1 can be made such that two glass mother substrates are attached or by the unit of display panel. Namely, two glass mother substrates such as the LCD or a PDP (Plasma Display Panel) can be etched in the attached state or the substrates can be etched by the unit of attached panels. In the present disclosure, the etching apparatus can automatically etch the substrate transferred from a previous processing line, so by applying the etching apparatus to the fabrication line of the display panel, the fabrication line can be completely automated. Namely, the substrate, which has undergone the previous process, is automatically inputted to the etching line, etched and then outputted so as to be automatically transferred to the previous fabrication line. As the fabrication line is automated, the fabrication of the display panel can be quickly made and the fabrication efficiency can be considerably improved.

In addition, the substrate 1 can be etched by glass mother substrates or by the processed glass substrates. Namely, the glass mother substrates fabricated during the glass fabrication process are etched to a desired weight and thickness and processed to be used as a substrate of the flat panel display device such as the LCD. In general, the flat panel display device such as the LCD includes two attached glass substrates, so its strength is higher than a single glass substrate. Thus, because it can be fabricated to be thinker than when using a single glass substrate, the weight of the glass substrate can be considerably reduced. In addition, the glass substrate having its original thickness (without being etched) is fabricated in a glass substrate fabrication process and transferred to the flat panel display device fabrication line and then etched, so damage of the substrate during the transferring can be prevented.

As mentioned above, the etching apparatus according to the present disclosure can be applied to various flat panel display device fabrication lines as well as for the LCD or PDP fabrication line, and the fabrication process of the LCD will now be described as just one of many examples.

Figure 11:
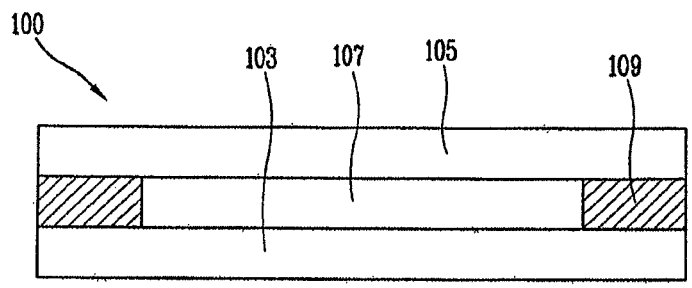
FIG. 11 shows the structure of a general liquid crystal display (LCD).

FIG. 11 shows the structure of a general liquid crystal display (LCD). As shown in FIG. 11, a liquid crystal panel 100 includes a lower substrate 103, an upper substrate 105 and a liquid crystal layer 107 formed between the lower substrate 103 and the upper substrate 105. The lower substrate 103 is a driving element array substrate. Although not shown, a plurality of pixels are formed on the lower substrate 103, and each pixel includes a driving element such as a thin film transistor (TFT). The upper substrate 105 is a color filter substrate and includes color filter layers for implementing an actual color. Pixel electrodes and common electrodes (not shown) are formed on the lower and upper substrates 103 and 105, and an alignment film for aligning liquid crystal molecules of the liquid crystal layer 107 is coated thereon.

The lower and upper substrates 103 and 105 are attached by a sealing material (or sealant) 109, between which the liquid crystal layer 107 is formed. The liquid crystal molecules driven by the driving element formed on the lower substrate 103 are driven to control an amount of light that transmits through the liquid crystal layer, to thus display information.

The fabrication processes of the LCD can be divided into a driving element array substrate process for forming the driving element on the lower substrate 103, a color filter substrate process for forming color filters on the upper substrate 105, and a cell process. The processes of the LCD will now be described with reference to FIG. 12 as follows.

Figure 12:
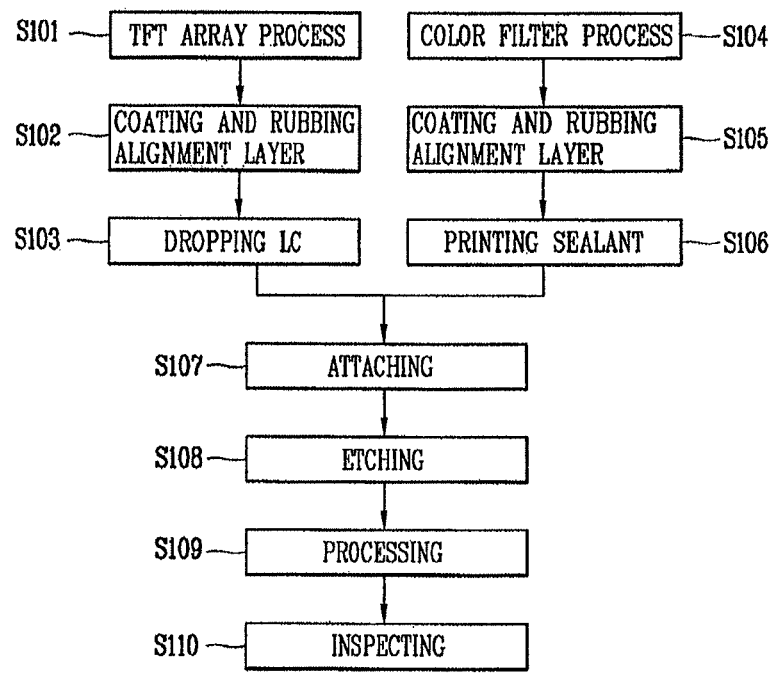
FIG. 12 is a flow chart showing a method for fabricating an LCD according to the present disclosure.

The method shown in FIG. 12 is a LCD fabrication process employing a liquid crystal dropping method. The liquid crystal dropping method is used for the following reasons.

In the related art, in order to form the liquid crystal layer, a liquid crystal dipping injection method is used. According to the liquid crystal dipping injection method, an injection hole is formed at the liquid crystal panel and liquid crystal is injected through the injection opening to form the liquid crystal layer. In this case, the injection of the liquid crystal is made by a pressure difference, and in general, a container filled with liquid crystal is provided within a vacuum chamber, the liquid crystal panel is positioned at the upper position, and the injection opening formed at the liquid crystal panel is allowed to contact with the liquid crystal. Then, the liquid crystal is injected into the liquid crystal panel due to a pressure difference between the liquid crystal panel and the vacuum chamber, thereby forming the liquid crystal layer.

However, the liquid crystal dipping injection method in which the liquid crystal is injected through the injection opening of the liquid crystal panel to form the liquid crystal layer within the vacuum chamber has the following problems.

First, time for injecting the liquid crystal into the liquid crystal panel is lengthened. In general, a gap between the driving element array substrate and the color filter substrate of the liquid crystal panel is quite narrow, namely, a few microns, so only a very small amount of liquid crystal is injected into the liquid crystal panel per unit time. For example, in case of fabricating a large scale liquid crystal panel, substantially tens of hours to several days are required for completely injecting the liquid crystal, which results a liquid crystal panel fabrication process that is lengthened by injecting the liquid crystal for a long time, degrading the fabrication efficiency.

Second, in the liquid crystal injection method, the liquid crystal consumption rate is high. Of liquid crystal filled in the container, only a small amount of liquid crystal is actually injected to the liquid crystal panel. Meanwhile, when the liquid crystal is exposed in the air or to a particular gas, it is reacted on the gas so as to be degraded, and also degraded by impurities introduced when contacting with the liquid crystal panel. Thus, even when the liquid crystal filled in the container is injected to a plurality of sheets of liquid crystal panels, liquid crystal remaining after injection should be discarded. Discarding of the high-priced liquid crystal causes an increase in the fabrication cost of the liquid crystal panel.

The liquid crystal dropping method is not to inject liquid crystal by the pressure difference between the interior and exterior of the panel but to drop and dispense liquid crystal directly onto the substrate and uniformly distribute it on the entire surface of the panel by an attachment pressure of the panel. According to the liquid crystal dropping method, the liquid crystal can be dropped directly onto the substrate for a short time, thus the liquid crystal layer of the large scale LCD can be quickly formed. In addition, because only the necessary amount of liquid crystal is dropped directly on the substrate, consumption of liquid crystal can be minimized and thus the fabrication cost of the LCD can be considerably reduced.

With reference to FIG. 12, in the driving element array process, a plurality of gate lines and a plurality of data lines are formed on the lower substrate 103, defining pixel regions, and thin-film transistors (TFTs), or driving elements, are formed to be connected with the gate lines and the data lines (S101). In addition, also in the driving element array process, pixel electrodes are formed to be connected with the TFTs and drive the liquid crystal layer when signals are applied through the TFTs. Red (R), Green (G) and Blue (B) color filter layers for implementing colors and common electrodes are formed on the upper substrate 105 in the color filter process (S104).

Subsequently, alignment films are coated on the TFT-formed lower substrate 103 and the color filter-layer formed upper substrate 105 and rubbed in order to provide anchoring force or a surface fixing force (namely, a pretilt angle and alignment direction) to liquid crystal molecules of the liquid crystal layer formed between the lower and upper substrates 103 and 105 (S102, S105). Thereafter, liquid crystal 107 is dropped onto a liquid crystal panel region of the lower substrate 105 and the sealant 109 is coated on an outer edge portion of the upper substrate (S103, S106).

Thereafter, in a state wherein the upper and lower substrates 103 and 105 are aligned, pressure is applied thereto to attach the upper and lower substrates 105 and 103 by the sealant 109. At the same time, the liquid crystal 107 is allowed to be dropped by applying pressure to uniformly spread on the entire surface of the attached substrates in the unit of mother substrates (S107).

Next, an etchant is sprayed to etch one surface or both surfaces of the attached substrates (S108). Meanwhile, a plurality of panel regions are formed on the large scale attached mother substrates and the TFTs, the driving elements, and the color filter layers are formed at each panel region, so in order to fabricate individual liquid crystal panels, the attached glass substrates are cut and processed so as to be divided into unit panels (S108, S109). Each unit panel is inspected to thus fabricate the LCD (S110).

As mentioned above, the LCD is completed through the TFT array process, the color filter process and the cell process. Each process is performed at each process line. Namely, the TFT substrate and color filter substrates are fabricated, liquid crystal is dropped, and the sealant is coated at the TFT array process line and the color filter process line, and the TFT substrate and the color filter substrate are attached, etched and processed into the liquid crystal panels at the cell process line. In addition, the TFT substrate line, the color filter substrate line, and the cell process line include a plurality of lines, not a single process line, respectively.

An etching line of the substrate included in the cell process line includes the etching apparatus as shown in FIG. 4. The etching apparatus automatically receives the substrate which has been processed in the previous process, etches it, and transfers it to the follow-up process, thereby automating the cell process line.

Figure 13A:
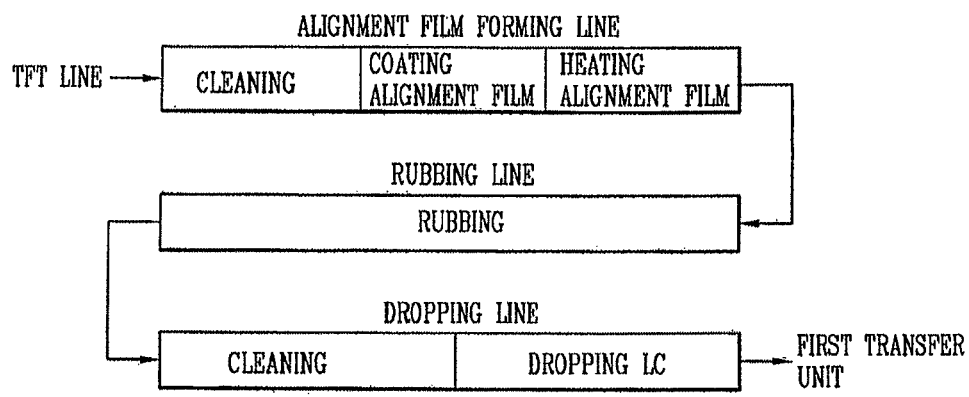
FIGS. 13A to 13E are block diagrams of a fabrication line for fabricating the LCD according to a method for fabricating the LCD illustrated in FIG. 12.
Figure 13B:
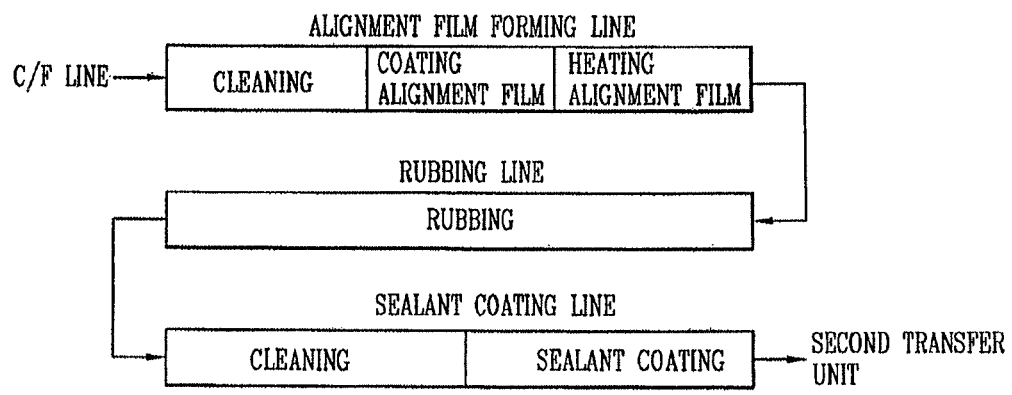
Figure 13C:
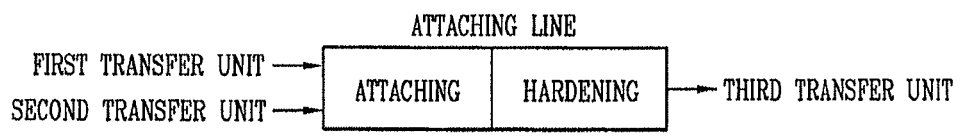
Figure 13D:
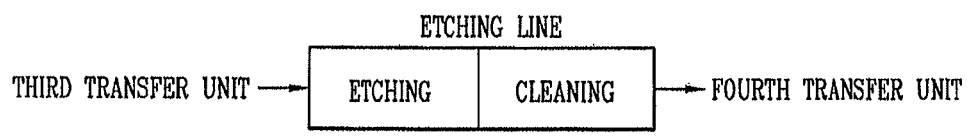
Figure 13E:
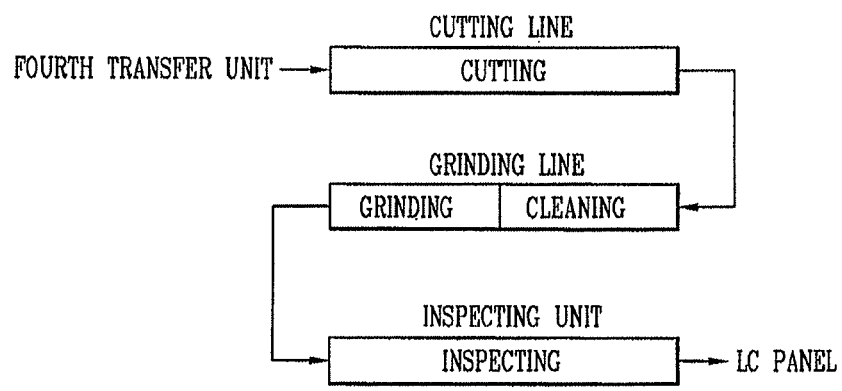

FIGS. 13A to 13E are block diagrams of a fabrication line for fabricating the LCD according to a method for fabricating the LCD employing the liquid crystal dropping method. FIGS. 13A and 13B are portions of the TFT line and the color filter line, respectively, and FIGS. 13C to 13E show the cell process line.

First, as shown in FIG. 13A, the lower substrate 103 with the TFTs formed at the TFT line undergoes an alignment film forming line, a rubbing line, and the liquid crystal dropping line. As shown, in the alignment film forming line, the lower substrate 103 with the TFTs are formed thereon is cleaned, an alignment film is stacked thereon, which is then heated at a high temperature. At the rubbing line, the alignment film formed on the lower substrate 103 is rubbed to form the anchoring force. In the liquid crystal dropping line, the lower substrate 103 with the alignment film formed thereon is cleaned, on which liquid crystal is dropped.

As shown in FIG. 13B, an alignment film with an anchoring force is formed on the upper substrate 105, on which the color filter layers has been formed thereon in the color filter line, at the alignment film forming line and the rubbing line, and the sealant is for attaching the lower and upper substrates 103 and 105 is coated on outer edges of the upper substrate 105 at a sealant coating line.

In general, the alignment film forming line, the rubbing line, the dropping line, and the sealant coating line are not continuous lines. Although not shown, a means, e.g., a device such as a robot, for moving the substrates 103 and 105 which have completed corresponding lines, is installed between respective process lines as shown in FIGS. 13A and 13B.

The alignment film forming line and the dropping line shown in FIG. 13A and the alignment film forming line and the sealant coating line as shown in FIG. 13B are the TFT and color filter lines. The reason for this is because in the TFT forming process, the alignment film forming and rubbing process, and the sealant coating process are performed on the upper substrate 106, which are independently executed on the respective substrates 103 and 105, and the follow-up process are performed on the lower and upper substrates together.

As shown in FIG. 13C, the TFT substrate and the color filter substrate on which the alignment film was formed, liquid crystal was dropped and the sealant was coated at the TFT line and the color filter line are inputted to an attaching line by first and second transfer units such that the TFT substrate and the color filter substrate are aligned. Pressure is applied to the TFT substrate and the color filter substrate so as to be attached. As pressure is applied, liquid crystal dropped on the TFT substrate spreads to form a uniform liquid crystal layer on the entire surface of the substrate. At the same time, heat via ultraviolet light is applied to the aligned substrates to harden the sealant to attach the substrates.

As shown in FIG. 13D, the substrates 1 (attached mother substrates) which have passed through the attaching line are inputted to the etching line and one or both sides thereof are etched by a pre-set thickness and cleaned. As shown in FIG. 4, at the etching line, the attached substrates by the unit of original plates 12 received in the cassette 44 transferred by a third transfer unit are automatically fixed at the etching cassette 44 by the first and second robots 30 and 35 and then etched. After the etching, the etched substrates by the unit of original plates are outputted in the reverse order and cleaned in a cleaning process.

Thereafter, the attached substrates etched at the etching line are inputted to a cutting line and cut to be divided into a plurality of unit panels. The divided unit panels are inputted to a grinding line and grinded and then cleaned. The grinded unit panels are inputted to an inspecting line and inspected, thereby completing the liquid crystal panel.

As shown, as for the fabrication line of the LCD according to the liquid crystal dropping method, the substrates undergo the alignment film forming line, the rubbing line, the liquid crystal dropping line, the sealant coating line, the attaching line, the etching line, the cutting line and the grinding line, to thus form the liquid crystal panels. At this time, the substrates are automatically transferred between respective lines by using the transfer unit such as an auto-feed carriage that transfers the cassette 44 for receiving the substrates 1, and loading or unloading the substrates 1 to or from the respective lines are automatically performed by using the loading and unloading unit such as the robot.

In the LCD fabrication method according to the present disclosure, one or both sides of the attached glass mother substrates are etched by a pre-set amount, so the weight of the fabricated liquid crystal panels can be considerably reduced. In addition, because the etching line of the liquid crystal panel is automatedly integrated with the previous and the following fabrication lines, the liquid crystal panels can be quickly etched.

Meanwhile, the LCD fabrication line according to the present disclosure can be installed as the multiple lines and can be also installed at a single line, namely, in-line. That is, on the TFT substrate and the color filter substrate on which the TFTs and the color filters have been formed respectively through the TFT array process and the color filter process, the alignment film is coated and rubbed through the same fabrication line to provide the anchoring force to the alignment film. In addition, the forming of the alignment film, the dropping of liquid crystal, and the coating of the sealant are performed on the TFT substrate and the color filter substrate at the same line. In addition and simultaneously, the substrates by the unit of the original plates are attached, etched, and processed into the unit panels. The unit panels are then inspected as to whether they are defective or not, to thus complete the liquid crystal panels.

Figure 14:
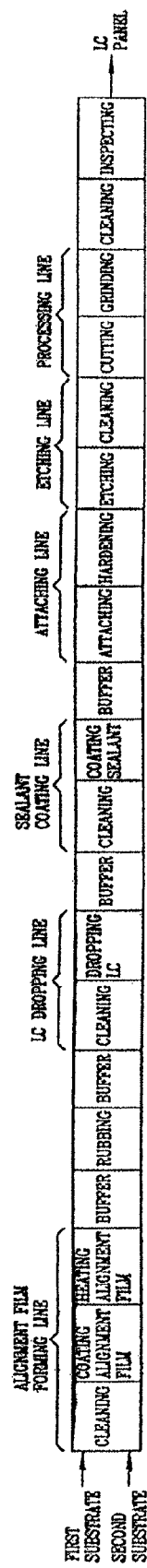
FIG. 14 is an integrated block diagram of the fabrication line for fabricating the LCD according to the method for fabricating the LCD illustrated in FIG. 12.

FIG. 14 shows the fabrication line in in-line form for performing the LCD fabrication method employing the liquid crystal dropping method. As shown in FIG. 14, the LCD fabrication line according to the liquid crystal dropping method includes the alignment film forming line, the rubbing line, the liquid crystal dropping line, the sealant coating line, the attaching line, the etching line, the processing line and the inspection line as one body to form a full in-line process, and as the substrates pass through the full in-line process, the liquid crystal panel is completed.

The TFT substrate and the color filter substrate, on which the TFTs and the color filter layers have been formed through the TFT process and the color filter process, respectively, are inputted to the alignment film forming line to form the alignment films. In this case, any one of the TFT substrate and the color filter substrate can be first inputted, and as an example, it is assumed that the TFT substrate is first inputted.

The substrate inputted to the alignment film forming line of a first line is cleaned, on which the alignment film is coated and then heated. When the process of forming the alignment film on the TFT substrate is terminated, the TFT substrate is inputted to a buffer line, and at the same time, the color filter substrate is inputted to the alignment film forming line.

The buffer line is to synchronize the TFT substrate and the color filter substrate. In the fabrication line according to the present disclosure, the TFT substrate and the color filter substrate are alternately inputted to the integrated fabrication line, on which each process is performed, so time at which the process of the TFT substrate is terminated and time at which the process of the color filter substrate is terminated are different. In addition, time taken at the two adjacent processes (lines) is also different, resulting in interference between the TFT substrate and the color filter substrate due to the time difference. Thus, by storing the TFT substrate and the color filter substrate that have finished a single process at the buffer line for a certain time period, the TFT substrate and the color filter substrate are synchronized.

For example, when the process of forming the alignment film of the TFT substrate is terminated, the TFT substrate is inputted to the rubbing line and the color filter substrate is inputted to the alignment film forming line. In this case, because a time difference occurs between the process time of the rubbing line and that of the alignment film input line, the TFT substrate which has finished the alignment film forming process remains in at the buffer line for a certain time period.

As mentioned above, the TFT substrate which has finished the alignment film forming process remains at the buffer line for a certain time period and then is inputted to the rubbing line to provide the anchoring force to the alignment film, while the color filter substrate is inputted to the alignment film forming process and then inputted to the rubbing line to provide the anchoring force to the alignment film.

After the rubbing process, the dropping and sealant coating processes are separately performed on the TFT substrate and the color filter substrate, respectively. Thus, the TFT substrate which has undergone the rubbing line is inputted to the dropping process, on which liquid crystal is then dropped, and passes the sealant coating line as it is, namely, at which any process is not performed thereon. Meanwhile, the color filter substrate waits at the buffer of the rear stage of the rubbing line during the dropping process of the TFT substrate. Likewise, while the TFT substrate which has finished the dropping process waits at the buffer line of the rear stage of the sealant coating line, the color filter substrate is inputted to the sealant coating line and sealant is coated on outer edges of the substrate.

It can be substantially more preferable to change the order of the dropping line and the sealant coating line. The reason for this is because, when the TFT substrate is first inputted, while the TFT substrate that has finished the rubbing process is inputted to the dropping line (passing the sealant coating line) on which the dropping process is performed, the color filter substrate, which has finished the rubbing process, can be inputted to the sealant coating line and the sealant coating process can be performed thereon. In other words, when the sealant coating line is positioned at the front stage of the dropping line, the dropping line of the TFT substrate and the sealant coating process of the color filter substrate can be simultaneously performed during a certain time period, and thus, the fabrication process can be performed more quickly by such disposition of the fabrication line.

In addition, the sealant can be coated on the TFT substrate simultaneously with the liquid crystal being dropped to the color filter substrate. In this case, only the type of the substrates inputted to the dropping and the sealant coating lines is performed simultaneously; otherwise, the overall process order is the same.

The attached TFT substrate and the color filter substrate are etched by the pre-set thickness at the etching line. In this case, the etching line includes an etching cassette for fixing the attached TFT substrate and the color filter substrate by the unit of the original plates and a cassette fixing unit for fixing the etching cassette, which is inputted to the etching apparatus. When the attached substrates 1 by the unit of the original plates are loaded to the etching cassette, they are loaded into the etching apparatus in a state of being automatically fixed by the holder by gravity or in a state of being fixed by the operation of the clamping according to detecting of the sensor, etched, and then automatically released from the holder according to a lifting force of the robot or released by releasing the clamping.

The etching line is performed in-line with the previous line (namely, the liquid crystal injecting line) and with the following line (inspection line), so the cassette for transferring the attached substrates 1 by the unit of the original plates is not necessary as shown in FIG. 4. Namely, in loading the substrates 1 to the etching line, when the substrates 1 processed in the previous line are automatically transferred by the transfer unit such as the conveyer, they are inputted to the etching apparatus by the robot. And, in loading the substrates 1, the attached substrates 1 from the unit of the original plates 12 which have finished the etching are outputted from the etching apparatus 10 by the robot and then transferred to the following line by using the transfer unit such as the conveyer.

In other words, in the present embodiment, when the attached substrates 1 processed in the previous line are transferred sequentially to the first robot 30, the first robot 30 sequentially transfers the inputted substrates to the second robot 35, the substrates loaded from the second robot 35 is fixed at the etching cassette 44, and the cassette fixing unit 40 where the etching cassette 44 is installed and inputted to the etching apparatus to perform the etching.

When the etching is finished, the substrates 1 are outputted from the etching line in the reverse order to that of the order of input to the etching line, and then transferred to the following line, namely, the processing line. In this case, transferring of the substrates from the previous line to the etching line or from the etching line to the following line is made by the transfer unit such as the conveyer. The attached substrates 1 inputted to the processing line are processed by the unit of panels, and the processed unit panels are inspected at the inspection line, thus completing the LCD panels.

As stated above, in the present disclosure, the TFT substrate and the color filter substrate are inputted to the integrated in-line fabrication line to complete the liquid crystal panels. Because the processes are performed by an integrated single line, the number of fabrication lines can be reduced and thus the fabrication cost can be reduced. In addition, because a high-priced automatic transfer unit for transferring the substrates or the liquid crystal panels between the lines is not required, the fabrication cost of the LCD can be reduced and the fabrication time can be considerably shortened.

The structure of LCD has been described limitedly in the above description, but without being limited thereto, the present disclosure can be applied to any structure of LCDs. In addition, the present disclosure is not limited to etching of a particular substrate, but can be used for etching glass mother substrate, attached glass mother substrates, processed glass substrate, and attached unit panels.

In addition, the present disclosure can be applied to fabrication methods of various flat panel display devices such as PDP, FED, VFD, OLED, and the like. As so far described, according to the present disclosure, the substrates and the liquid crystal panels are etched to have the pre-set thickness, the weight of the LCD can be considerably reduced. In addition, because etching of the substrates and the liquid crystal panels is automatically performed at the fabrication line, the substrates and the liquid crystal panels can be quickly etched.

As the present disclosure may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

The invention claimed is:

1. A fabrication line of a liquid crystal display comprising:
a thin film transistor (TFT) line that receives a first substrate and forms TFTs;
a color filter line that receives a second substrate and forms color filter layers;
a dropping line that drops liquid crystal onto the first substrate;
an attaching line that attaches the first and second substrates to form a liquid crystal layer; and
an etching line that etches the attached first and second substrates,
a transfer unit between the TFT line, the color filter line, the attaching line, and the etching line to transfer the process-finished substrate to each follow-up process,
wherein the etching line includes:
a cassette to receive the first and second substrates attached at the attaching line and transferred by a transfer unit;
a first robot to take the attached first and second substrates out of the cassette;
a second robot to receive the attached first and second substrates from the first robot so as to be mounted thereon and that is movable vertically up and down;
an etching cassette comprising a support to support the attached first and second substrates and a substrate fixing unit to fix the first and second substrates loaded by the second robot;
a cassette fixing unit to fix at least one or more etching cassettes and rotated at a pre-set angle to allow a unit panel to be disposed vertically, the cassette fixing unit including, the cassette fixing unit including a plurality of clampings disposed in at least both sides of the etching cassette to fix the loaded substrate, a clamping driving unit to rotate the clampings, to fix the substrate, a fixing pin to fix one end portion of the clamping to the clamping driving unit, a rotatable pin to rotatably fix the clamping to the etching cassette, and a guide groove defined on the etching cassette to enable the rotatable pin to move therealong the movement of the clamping driving unit is converted to a rotation of the clampings by moving the rotatable pin along the guide groove;
an etching apparatus for etching the first and second substrates disposed vertically by the cassette fixing unit.

2. The fabrication lien of claim 1, wherein the attaching line comprises: an attaching line that attaches the first and second substrates by a sealant to form the liquid crystal layer; and a hardening line that hardens the sealant.

3. The fabrication line of claim 2, wherein the second alignment film forming line comprises a sealant coating line that coats the sealant on the second substrate.

4. The fabrication line of claim 1, further comprising:
   a first alignment film forming line that receives the first substrate and forms a first alignment film with an anchoring force formed thereon; and
   a second alignment film forming line that receives the second substrate and forms a second alignment film with an anchoring force formed thereon.

5. The fabrication line of claim 1, further comprising: a cutting line that cuts the etched substrate to form a unit panel.

6. The fabrication line of claim 1, further comprising: an inspection line that inspects the unit panel with the liquid crystal layer.

7. The fabrication line of claim 1, wherein the first robot comprises:
   a robot arm to take the first and second substrates out of the cassette; and
   a rotational shaft to transfer the extracted first and second substrates to the second robot.

8. The fabrication line of claim 1, wherein the second robot comprises:
   a substrate mounting part to enable the first and second substrates to be mounted thereon; and
   an extending shaft that moves vertically up and down.

9. The fabrication line of claim 1, wherein the etching apparatus comprises:
   a plurality of spray plates disposed vertically, at least one surface thereof being adjacent to the attached first and second substrates, and having an etchant filled therein; and
   a plurality of nozzles disposed on the spray plates to spray the etchant onto the attached first and second substrates.

10. A fabrication line of a liquid crystal display comprising:
    a liquid crystal dropping line that receives a first substrate and drops liquid crystal onto the first substrate;
    a sealant coating line that receives a second substrate and coats a sealant; an attaching line that receives and attaches the first and second substrates; and
    an etching line that etches the attached first and second substrates, wherein the liquid crystal dropping line, the sealant coating line, the attaching line, and the etching line are integrated,
    wherein the etching line including:
      a cassette to receive the first and second substrates attached at the attaching line and transferred by a transfer unit;
      a first robot to take the attached first and second substrates out of the cassette;
      a second robot to receive the attached first and second substrates from the first robot so as to be mounted thereon and movable vertically up and down;
      an etching cassette comprising a support to support the attached first and second substrates and a substrate fixing unit to fix the first and second substrates loaded by the second robot;
      a cassette fixing unit to fix at least one or more etching cassettes and rotated at a pre-set angle to allow the attached first and second substrates to be disposed vertically, the cassette fixing unit including a plurality of clampings disposed in at least both sides of the etching cassette to fix the loaded substrate, a clamping driving unit to rotate the clampings, to fix the substrate, a fixing pin to fix one end portion of the clamping to the clamping driving unit, a rotatable pin to rotatably fix the clamping to the etching cassette, and a guide groove defined on the etching cassette to enable the rotatable pin to move therealong, the movement of the clamping driving unit is converted to a rotation of the clampings by moving the rotatable pin along the guide groove;
      an etching apparatus for etching the first and second substrates disposed vertically by the cassette fixing unit.

11. The fabrication line of claim 10, further comprising:
    an alignment film forming line that alternately receives the first substrate on which the liquid crystal is dropped and the second substrate on which the sealant is coated and forms an alignment film with an anchoring force formed thereon.

12. The fabrication line of claim 11, wherein the alignment film forming line comprises:
    an alignment film coating line that coats the alignment film on the first and second substrates which are alternately inputted;
    a heating line for heating the coated alignment film; and
    a rubbing line that rubs the heated alignment film to determine an alignment direction.

13. The fabrication line of claim 10, further comprising: a processing line that receives the attached first and second substrates and divides the attached first and second substrates into a plurality of unit panels.

14. The fabrication line of claim 10, wherein the first substrate is a thin film transistor (TFT) substrate on which TFTs are formed and the second substrate is a color filter substrate on which color filter layers are formed.

15. The fabrication line of claim 10, wherein at least one buffer line is installed between respective lines in order to synchronize the first and second substrates.

16. The fabrication line of claim 10, further comprising: an inspection line that inspects the divided unit panels.

17. The fabrication line of claim 10, wherein the first robot comprises:
    a robot arm to take the first and second substrates out of the cassette; and
    a rotational shaft to transfer the extracted first and second substrates to the second robot.

18. The fabrication line of claim 10, wherein the second robot comprises:
    a substrate mounting part to enable the first and second substrates to be mounted thereon; and
    an extending shaft that moves vertically up and down.

19. The fabrication line of claim 10, wherein the etching apparatus comprises:
    a plurality of spray plates disposed vertically, at least one surface thereof being adjacent to the attached first and second substrates, and having an etchant filled therein; and
    a plurality of nozzles disposed on the spray plates to spray the etchant onto the attached first and second substrates.

* * * * *